US006798294B2

(12) United States Patent
Kuiri

(10) Patent No.: US 6,798,294 B2
(45) Date of Patent: Sep. 28, 2004

(54) AMPLIFIER WITH MULTIPLE INPUTS

(75) Inventor: Tapio Kuiri, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/243,358

(22) Filed: Sep. 13, 2002

(65) Prior Publication Data

US 2003/0058050 A1 Mar. 27, 2003

(30) Foreign Application Priority Data

Sep. 21, 2001 (FI) .............................................. 20011866

(51) Int. Cl.$^7$ .............................................. H03F 3/68
(52) U.S. Cl. .................................. 330/295; 330/124 R
(58) Field of Search .............................. 330/124 R, 147, 330/148, 254, 295, 311; 327/359

(56) References Cited

U.S. PATENT DOCUMENTS

| | | | | |
|---|---|---|---|---|
| 5,012,200 A | | 4/1991 | Meinzer | 330/124 |
| 5,541,554 A | | 7/1996 | Stengel et al. | 330/51 |
| 5,889,425 A | * | 3/1999 | Kimura | 327/359 |
| 5,896,062 A | | 4/1999 | Tiller et al. | 330/252 |
| 5,903,854 A | | 5/1999 | Abe et al. | 455/575 |
| 5,933,771 A | * | 8/1999 | Tiller et al. | 330/254 |
| 5,999,056 A | | 12/1999 | Fong | 330/278 |
| 6,029,052 A | * | 2/2000 | Isberg et al. | 455/131 |
| 6,046,640 A | * | 4/2000 | Brunner | 330/254 |
| 6,049,251 A | * | 4/2000 | Meyer | 330/295 |
| 6,100,761 A | * | 8/2000 | Ezell | 330/254 |
| 6,392,487 B1 | * | 5/2002 | Alexanian | 330/254 |
| 6,538,501 B2 | * | 3/2003 | Madni | 330/261 |

FOREIGN PATENT DOCUMENTS

| | | |
|---|---|---|
| EP | 0883241 A1 | 12/1998 |
| EP | 0 886 384 A2 | 12/1998 |
| EP | 0964511 A1 | 12/1999 |
| EP | 1 081 849 A1 | 3/2001 |
| EP | 1148633 A1 | 10/2001 |
| EP | 1193863 A2 | 4/2002 |
| JP | 10313259 | 11/1998 |
| WO | WO-97/24800 A1 | 7/1997 |
| WO | WO-99/50956 | 10/1999 |
| WO | WO-00/8748 A1 | 2/2000 |
| WO | WO-00/19629 | 4/2000 |

OTHER PUBLICATIONS

Atkinson, S. et al., "Integration Trends with RF Silicon Technologies in Mobile Radio Applications", 1998, IEEE Radio Freqneuch Circuits Symosium, pp. 83–86.

Bailey, M. et al., "An Integrated RF Front–End for Multi–Mode Handsets", 2000, IEEE MTT–S Digest, pp. 1269–1272.

* cited by examiner

Primary Examiner—Khanh Van Nguyen
(74) Attorney, Agent, or Firm—Harrington & Smith, LLP

(57) ABSTRACT

A low noise amplifier (500) is provided for amplifying signals in a frequency band. The low noise amplifier (500) comprises several amplifying elements (505, 506) that share a load impedance (503) and a degeneration impedance (504). One of the amplifying elements (505, 506) is activated at a time that the rest are deactivated. The activation and deactivation is done by feeding a bias to a bias port (501, 507) or grounding the same, respectively. A signal to be amplified is fed to the corresponding input (511, 512) depending on which of the amplifying elements (505, 506) is activated. An amplified signal is obtained at an output (513).

33 Claims, 4 Drawing Sheets

AMPLIFIER WITH MULTIPLE INPUTS

SCOPE OF THE INVENTION

The invention relates to low noise amplifiers (LNAs). It is particularly related to an LNA having multiple inputs in several frequency bands.

BACKGROUND OF THE INVENTION

A radio signal sent from a transmitter through a radio channel and received by a receiver suffers from propagation loss. Even though the transmission power from a transmitter such as a base station may be high, the received signal at a receiver such as a mobile station may be very low. According to the GSM standard, a mobile station needs to be able to receive signals of a level of −102 dBm without excessive Bit Error Rate (BER).

The propagation loss is not the only factor having an impact on radio reception. The transmitted signal is further reflected from various surfaces on its way causing multipath propagation. The signals arriving at the receiver via different paths may have opposite or interfering phases and thus may cancel each other out or interfere with each other. Noise from several sources, for example other mobile stations or systems, broadcast systems, radar and non-electromagnetic compatibility (EMC) compliant devices may also be added to the signal.

Low Noise Amplifiers (LNAs) are typically used as a first amplifying stage in radio receivers to amplify a received low-level radio signal to a higher level by adding as little noise as possible to the signal. In communications systems that just use one frequency band one LNA can be optimised for that particular frequency band.

To optimise an LNA for a certain frequency band, inductors are commonly used. Traditionally inductors have been bulky components, whereas a general aim in all electronics design is miniaturisation. Also radio receivers are commonly wanted to be implemented by integrated circuits, where inductance can be realized by planar inductors. Planar inductors, however, still need to use a large area of a semiconductor die compared to transistors.

The diversity of different mobile communications standards around the world has raised a need for mobile stations capable of communicating in several frequency bands. A mobile station can be constructed to work in several communications systems using different frequency bands, such as the 900 MHz GSM (Global System for Mobile Communications) system in Europe and the 1900 MHz TDMA (Time Division Multiple Access) system in US. Several frequency bands can also exist within one single system. For example, GSM systems now work in 900 MHz and 1800 MHz frequency bands in Europe and in 1900 MHz frequency band in the USA. The GSM system will be implemented in the USA also in the 800 MHz frequency band and will, thus, be using two separate frequency bands also in the USA. The third generation cellular communications system known as Universal Mobile Telephone System (UMTS) being specified by Third Generation Partnership Project (3GPP) also uses several frequency bands. A single mobile station working according to two systems, out of which at least one uses several frequency bands, has to use at least three frequency bands.

In order to provide this functionality, it has been proposed to use a dual band receiver such as the dual band receiver 100 shown in FIG. 1. The dual band receiver 100 comprises two receiver branches 103, 104 sharing an antenna 101 for receiving an RF signal and a band switch 102. The receiver branches 103, 104 further comprise band-pass filters 111, 121, LNAs 112, 122 as well as in-phase mixers (I-mixers) 131, 141 and quadrature-phase mixers (Q-mixers) 135, 145 for mixing the RF signal with the respective local oscillator signals. Further, the receiver branches 103, 104 comprise I-filters 133, 143 and Q-filters 137, 147, I-Local Oscillator (I-LO) inputs 132, 142, Q-Local Oscillator (Q-LO) inputs 136, 146 as well as I-outputs 134, 144 and Q-outputs 138, 148. The LNAs 112, 122 may be, for example, variable gain LNAs, as described in the U.S. Pat. Nos. 5,999,056 (Fong) or 6,046,640 (Brunner).

An RF signal sent by a Base Transceiver Station (BTS, not shown) is received by the antenna 101. According to which frequency band the RF signal occupies, it is connected by the band switch 102 to either one of the receiver branches 103, 104. The band switch 102 is controlled by a control signal from a controlling unit (not shown). If a first frequency band is used, the RF signal is connected to the receiver branch 103, where the RF signal is first filtered by the band-pass filter 111. After filtering, the RF signal is amplified by the LNA 112, which has been optimised for the first frequency band. The amplified RF signal is split and routed to the I-mixer 131 and to the Q-mixer 135. An I-LO signal is injected to the I-LO input 132 and a Q-LO signal is injected to the Q-LO input 136. The I-LO signal and the Q-LO signal are at the same frequency, but with a 90-degree phase difference. The I-mixer 131 and the Q-mixer 135 form downconverted signals by mixing the RF-signal and the injected LO-signals. From the I-mixer 131 the downconverted signal is fed to the I-filter 133 and the resultant I-signal is output through the I-output 134. From the Q-mixer 135 the downconverted signal is fed to the Q-filter 137 and the resultant Q-signal is output through Q-output 138.

If the RF signal occupies a second frequency band for which the receiver branch 104 is suitable, the receiver branch 104 will be chosen by the band switch 102. The operation of the receiver branch 104 corresponds to that of the receiver branch 103 as described above.

The solution of the dual band receiver 100 is complicated because it demands two full receiver branches, one for each frequency band which is used. Therefore, alternative dual band receiver arrangements have been proposed.

An alternative dual band receiver 200 known in the prior art and shown in FIG. 2 comprises an antenna 201, a first band switch 202, a band-pass filter 203, 204 for each one of the used frequency bands, a second band switch 206, an LNA 205 and a micro controller 208. The dual band receiver 200 further comprises an I-mixer 211, an I-LO input 212, an I-filter 213, and an I-output 214, as well as a Q-mixer 215, a Q-LO input 216, a Q-filter 217, and a Q-output 218.

An RF signal sent by a BTS (not shown) is received by the antenna 201. According to which frequency band the RF signal occupies it is connected by the first band switch 202 to either one of the band-pass filters 203, 204. The first band switch 202 and the second band switch 206 are controlled synchronously by a control signal from the micro controller 208. If the RF-signal occupies a first frequency band, the RF signal is connected to the band-pass filter 203. After the RF signal has been filtered, the second band switch 206 connects the used band-pass pass filter 203 to the LNA 205 so that the RF signal can be amplified. The amplified RF signal is split and routed to the I-mixer 211 and to the Q-mixer 215. An I-LO signal is injected to the I-LO input 212 and a Q-LO signal is injected to the Q-LO input 216. The I-LO signal and the Q-LO signal are at the same frequency, but with a 90-degree phase difference. The I-mixer 211 and the Q-mixer 215 form downconverted signals each by mixing the RF signal and the injected LO-signals. From the I-mixer 211 the downconverted signal is fed to the I-filter 213 and the resultant I-signal is output through the I-output 214. From the Q-mixer 215 the downconverted signal is fed to the Q-filter 217 and the resultant Q-signal is output through Q-output 218.

If the RF-signal occupies a second frequency band, the RF signal is connected to the band-pass filter 204. After the RF signal has been filtered, the second band switch 206 connects the used band-pass filter 204 to the LNA 205 so that the RF signal can be amplified. The amplified RF signal is handled in a way corresponding to that described in the preceding paragraph.

The dual band receiver 200 has a number of disadvantages. First of all, the additional second band switch 206 introduces extra noise before the LNA 205 on the signal path. Any additional noise before amplification directly decreases signal to noise ratio and should therefore be avoided. This embodiment also makes the optimisation of the LNA 205 more difficult. On the other hand, differential input and output signals are preferred because of the common mode interference rejection. The second band switch 206 makes it difficult to implement differential signals. Thus, the solution of the dual band receiver 200 is not ideal.

The construction of a typical LNA 300 known in the prior art is described with reference to FIG. 3. The LNA 300 comprises a transistor 304 with a load impedance 303 and a degeneration impedance 305. The LNA 300 is operated by power supply 302 and biased by a current fed to the circuit from port Bias 301. A signal to be amplified is fed to RF-in 311 and an amplified signal is output at RF-out 312. The load impedance 303 has an impact on the gain of the LNA 300 and in part also matches the output of the LNA 300 to an external load (not shown). The degeneration impedance 305 is used to linearize the gain of the LNA 300.

If an embodiment of a radio receiver according to FIG. 1 is used, each one of the LNAs 112, 122 need separate load and degeneration circuits as shown by the load impedance 303 and the degeneration impedance 305 in FIG. 3. The load impedance 303 and the degeneration impedance 305 can be implemented by a Inductor-Resistor-Capacitor (LRC) circuitry comprising inductors, resistors and/or capacitors (not shown). In its simplest form the LRC circuitry is often just an inductor, which needs to use a large area of a semiconductor die. The transistor 304 does not need to use a large area in the semiconductor die. The fact of having separate load and degeneration impedance for each LNA leads to a multiplication in the number of impedances 303, 305 and thus to a great increase in the usage of area of the semiconductor die. This problem increases with the number of frequency bands that a radio receiver is constructed to handle.

There is, thus, clearly a need for a multi-band radio receiver LNA architecture that suits well for implementation on an integrated circuit with as small semiconductor die area usage as possible.

SUMMARY OF THE INVENTION

In a first aspect of the invention there is provided a low noise amplifier comprising a plurality of amplifying elements, each one of the plurality of amplifying elements being connected to a load impedance and to a degeneration impedance and being configured to amplify signals in a frequency band, the low noise amplifier being characterised in that the plurality of amplifying elements are connected in parallel. the other amplifying elements. In a fifth embodiment of the invention the degeneration impedance is common to the amplifying elements, but at least one of the amplifying elements has a load impedance that is not connected to all of the other amplifying elements.

The invention will be described by way of example only with reference to the accompanying drawings, in which.

DETAILED DESCRIPTION OF THE INVENTION

Figure 4:
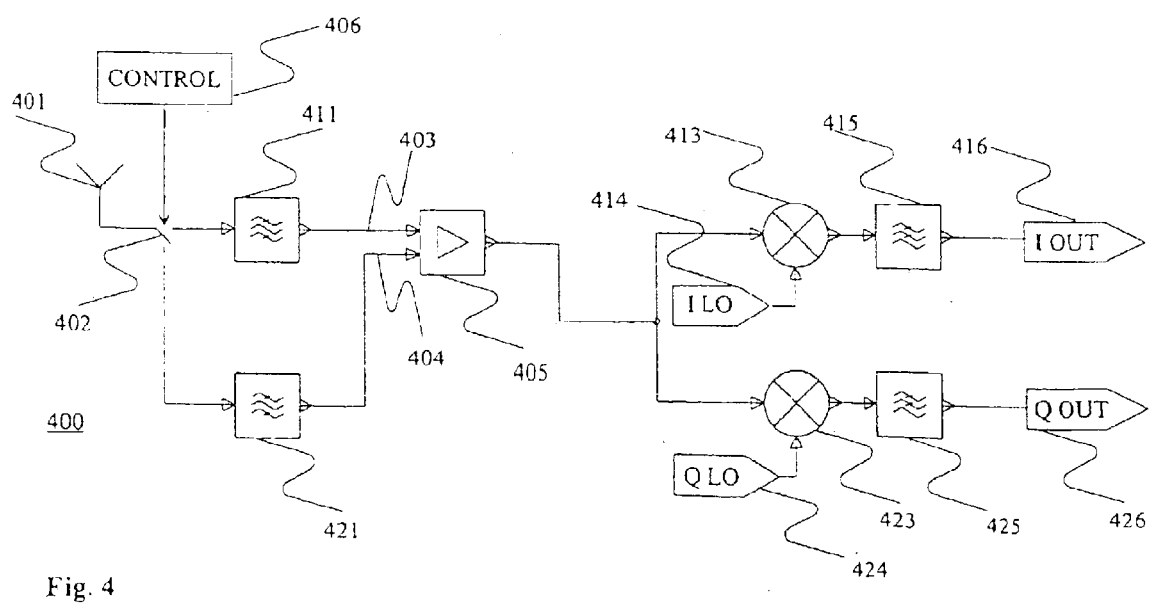
FIG. 4 shows a receiver incorporating an LNA according to the present invention.

A receiver 400 incorporating an LNA according to the present invention is shown in FIG. 4. The receiver 400 comprises an antenna 401, a band switch 402, an In a second aspect of the invention there is provided a radio receiver comprising a low noise amplifier, wherein the low noise amplifier is comprising a plurality of amplifying elements, each one of the plurality of amplifying elements being connected to a load impedance and to a degeneration impedance and being configured to amplify signals in a frequency band, the radio receiver being characterised in that the plurality of amplifying elements are connected in parallel.

In a third aspect of the invention there is provided a mobile station capable of communicating on a plurality of frequency bands and comprising a receiver, the receiver further comprising a plurality of amplifying elements, each one of the plurality of amplifying elements being connected to a load impedance and to a degeneration impedance and being configured to amplify signals on one of the plurality of frequency bands, the mobile station being characterised in that the plurality of amplifying transistors are connected in parallel At least part of the load impedances and the degeneration impedances are preferably common to the plurality of amplifying elements. It is preferred that only one of the amplifying elements is activated at a time and the rest of the amplifying elements are deactivated. The activation and deactivation is preferably done by feeding a bias current to a bias port of the amplifying element or grounding the bias port, respectively. The load impedance and the degeneration impedance preferably comprise a component selected from a group consisting of an inductor, a capacitor and a resistor.

In a first embodiment of the invention each of the amplifying elements comprise a transistor in single ended configuration. In a second embodiment of the invention the low noise amplifier comprises a cascade stage connected between the load impedance and at least one of the plurality of amplifying elements. In a third embodiment of the invention each of the amplifying elements comprise a pair of transistors in differential configuration. In a fourth embodiment of the invention the load impedance is common to the amplifying elements, but at least one of the amplifying elements has a degeneration impedance that is not connected to all of LNA 405 according to the present invention, a micro controller 406, an I-mixer 413, a Q-mixer 423, an I-filter 415 and a Q-filter 425. It should be noted that all of these elements are used in common to handle different frequency bands. The receiver 400 further comprises separate bandpass filters 411, 421 to handle the different frequency bands. The LNA 405 comprises respectively an input 403, 404 for each one of the different frequency bands. The I-mixer 413 comprises an I-LO signal port 414 and the Q-mixer a Q-LO port 424. The receiver 400 still further comprises an I-output 416 and a Q-output 426.

When an RF signal coming from a BTS (not shown) is received by the antenna 401, the switch 402 is controlled by the micro controller 406 to connect the RF signal to the band-pass filter 411 or the band-pass filter 421 depending on whether the RF signal is carried by a frequency in a first frequency band or in a second frequency band. After being filtered by the band-pass filter 411, 421, the RF signal is fed to the LNA 405 through one of the inputs 403, 404 depending on the used frequency band. The amplified RF signal output by the LNA 405 is split and fed to the I-mixer 413 and to the Q-mixer 423. The I-LO signal and the Q-LO signal are identical except that the Q-LO signal is phase-shifted by 90 degrees relative to the I-LO signal. The mixers 413, 423 downconvert the amplified RF signal fed into them to an I-signal, which is filtered by the I-filter 415 and output at I-output 416, and to a Q-signal, which is filtered by the Q-filter 425 and output at the Q-output 426.

In the following, several embodiments of LNAs are described which can be used as the LNA 405 in the receiver 400.

Figure 5:
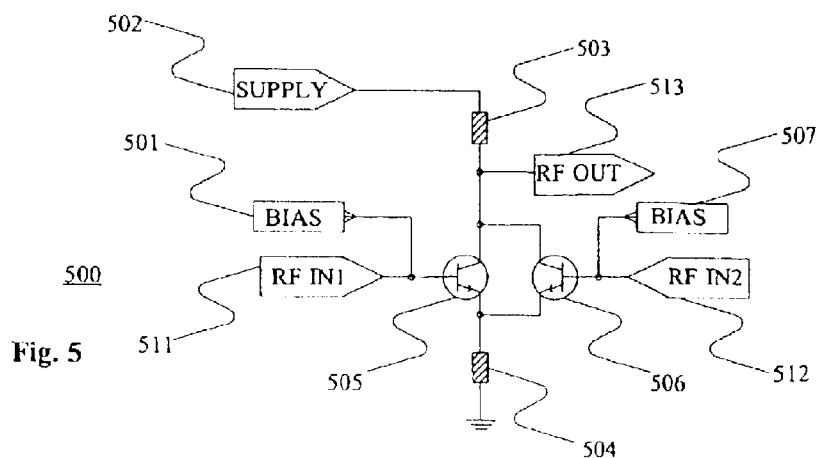
FIG. 5 shows an LNA according to a first embodiment of the present invention.

An LNA 500 according to a first embodiment of the present invention is shown in FIG. 5. The LNA 500 comprises transistors 505, 506 sharing a load impedance 503 and a degeneration impedance 504. The LNA 500 is powered by a power supply 502. Furthermore, the LNA 500 comprises a port Bias 501 to apply a current to bias the transistor 505 and a port Bias 507 to apply a current to bias the transistor 506. The LNA also comprises an RF-input 511, an RF-input 512 and an RF-output 513.

In operation, the power supply 502 is connected to an operating voltage. According to the frequency band in use either one of the RF-inputs 511, 512 is activated by feeding a current to the corresponding port Bias 501, 507. In the case that the LNA 500 is to handle the RF-signal in the first frequency band, a bias current is fed to the port Bias 501 to activate the transistor 505. At the same time the port Bias 507 is connected substantially to ground potential to deactivate the transistor 506. The RF-signal is input to the RF-input 511 and fed further to the transistor 505, which amplifies the RF-signal. The amplified RF-signal is then output through the RF-output 513.

In a similar manner, in the case that the LNA 500 is to handle the RF-signal in the second frequency band, a bias current is fed to the port Bias 507 to activate the transistor 506. At the same time the port Bias 501 is connected substantially to ground potential to deactivate the transistor 505. The RF signal is input to the RF-input 512 and fed further to the transistor 506, which amplifies the RF signal. The amplified RF signal is then output through the RF-output 513

Figure 6:
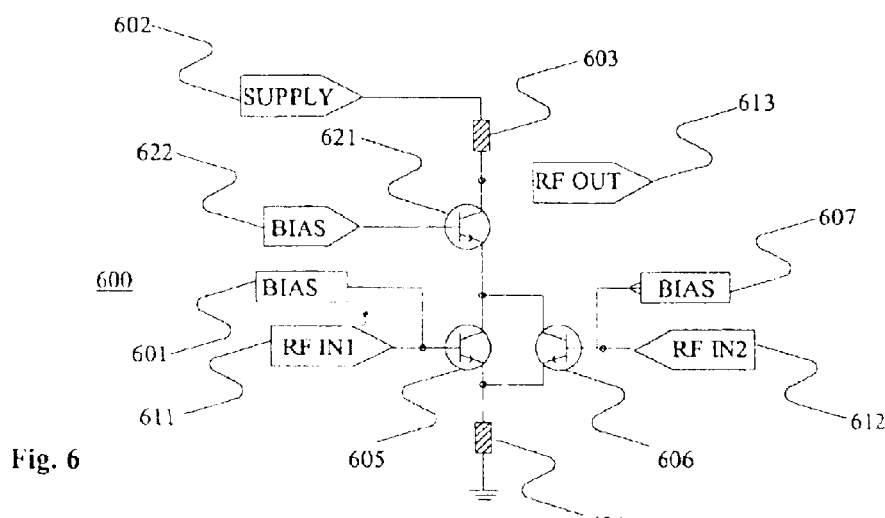
FIG. 6 shows an LNA according to a second embodiment of the present invention.

An LNA 600 according to a second embodiment of the present invention is shown in FIG. 6. The LNA 600 comprises transistors 605, 606 sharing a load impedance 603 and a degeneration impedance 604. The LNA 600 is powered by a power supply 602. Further, the LNA 600 comprises a port Bias 601 for a current to bias the transistor 605 and a port Bias 607 for a current to bias the transistor 606. The LNA 600 comprises an RF-input 611, an RF-input 612 and an RF-output 613. The LNA 600 differs from the LNA 500 of FIG. 5 in that the load impedance 603 is connected to the transistors 605, 606 through a cascade transistor 621. The cascade transistor 621, which can also be referred to as cascade stage, is biased by a current fed to a port Bias 622. The LNA 600 has advantages over the LNA 500 by virtue of the additional cascade transistor 621. These comprise a better reverse attenuation, higher output impedance of the LNA and suitability for gain switching.

In operation, the power supply 602 is connected to an operating voltage. According to the frequency band in use either one of the RF-inputs 611, 612 is activated by feeding a bias current to the corresponding port Bias 601, 607. In the case the LNA 600 is to handle the RF-signal in the first frequency band, the bias current is fed to the port Bias 601 to activate the transistor 605. At the same time the port Bias 607 is connected substantially to ground potential to deactivate the transistor 606. The RF-signal is input to the RF-input 611 and fed further to the transistor 605, which amplifies the RF-signal. The amplified RF-signal is then output through RF-output 613.

In a similar manner, in the case where the LNA 600 is to handle the RF-signal in the second frequency band, the bias current is fed to the port Bias 607 to activate the transistor 606. At the same time the port Bias 601 is connected substantially to ground potential to deactivate the transistor 605. An RF-signal is input to the RF-input 612 and fed further to the transistor 606, which amplifies the RF-signal. The amplified RF-signal is then output through RF-output 613.

Interference is always coupled to signals to be amplified. In single ended LNA embodiments this interference is also amplified. Processing signals in differential form, instead, helps solving this problem. In an LNA embodiment having differential processing interference couples equally to both inverting and non-inverting inputs and they thus compensate each other.

Figure 7:
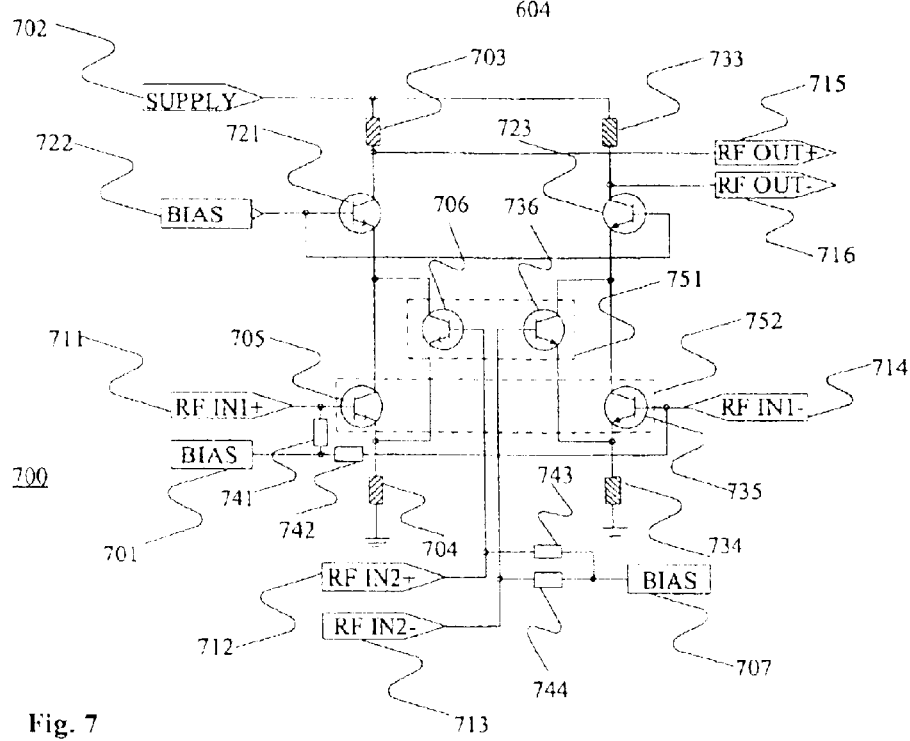
FIG. 7 shows an LNA according to a third embodiment of the present invention

FIG. 7 shows an LNA 700 according to a third embodiment of the present invention with differential input and differential output signals. The LNA 700 comprises transistors 705, 706, 735, 736. The transistors 705, 735 form a pair of transistors in differential configuration 752. The transistors 706, 736 form another pair of transistors in differential configuration 751. The transistors 705, 706 share a load impedance 703 and a degeneration impedance 704. The transistors 735, 736 share a load impedance 733 and a degeneration impedance 734. The LNA 700 is powered by a power supply 702. The transistors 705, 735 are biased by a current fed to port Bias 701 and the transistors 706, 736 are biased by a current fed to port Bias 707. The port Bias 701 is connected to the transistors 705, 735. This is done through resistors 741, 742 so as not to connect a non-inverting RF-input 711 and an inverting RF-input 714. The port Bias 707 is connected to the transistors 706, 736. This is done through resistors 743, 744 so as not to connect a non-inverting RF-input 712 and an inverting RF-input 713. The LNA 700 further comprises RF-outputs 715, 716. The LNA 700 also comprises cascade transistors 721, 723, which connect the load impedances 703, 733 to the respecting pairs of the transistors 705 and 706 and 735 and 736. These cascade transistors 721, 723 together can be referred to as cascade stage. The cascade transistors 721, 723 are biased by a current fed to port Bias 722. With the cascade transistors 721, 723 the LNA 700 gets better reverse attenuation, higher output impedance and the LNA 700 further becomes suitable for gain switching.

In operation, the power supply 702 is connected to an operating voltage. According to the frequency band in use either pair of the RF inputs 711, 714 or the RF-inputs 712, 713 are activated by feeding a bias current to the corresponding port Bias 701, 707. In the case that the LNA 700 is to handle the RF-signal in the first frequency band, a bias current is fed to the port Bias 701 to activate the transistors 705, 735. At the same time the port Bias 707 is connected substantially to ground potential to deactivate the transistors 706, 736. An RF-signal is input to the RF-inputs 711, 714 and fed further to the transistors 705, 735, which amplify the RF-signal. The amplified RF-signal is then output through the RF-outputs 715, 716.

In a similar manner in the case that the LNA 700 is to handle the RF-signal in the second frequency band, a bias current is fed to the port Bias 707 to activate the transistors 706, 736. At the same time the port Bias 701 is connected substantially to ground potential to deactivate the transistors 705, 735. An RF-signal is input to the RF-inputs 712, 713 and fed further to the transistors 706, 736, which amplify the RF signal. The amplified RF-signal is then output through the RF-outputs 715, 716.

In some embodiments it may be desirable for the amplifying transistors to share only either the load impedance, the degeneration impedance or both. These embodiments include the case in which the amplification in one band needs to differ from the amplification in another band and the case in which the frequency dependency of the amplifier load in one band differs from the amplifier load in another band.

Figure 9:
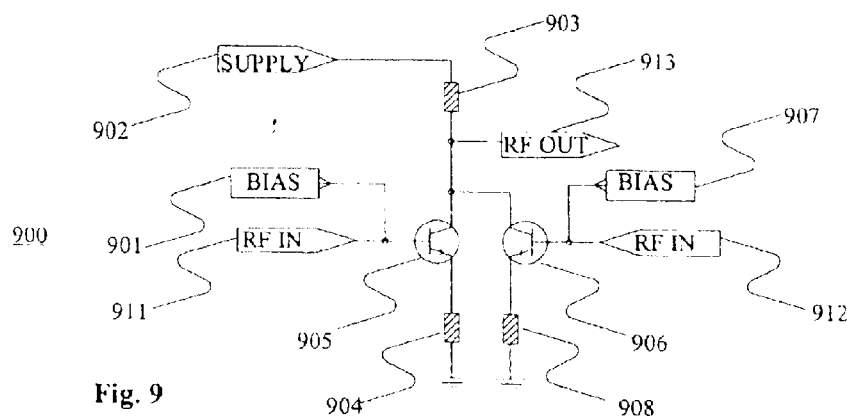
FIG. 9 shows an LNA according to a fourth embodiment of the present invention.

An LNA 900 according to a fourth embodiment of the present invention is shown in FIG. 9. The LNA 900 comprises transistors 905, 906 sharing a load impedance 903. The transistor 905 further has a degeneration impedance 904 and the transistor 906 a degeneration impedance 908. The LNA 900 is powered by a power supply 902. Further the LNA 900 comprises a port Bias 901 for a current to bias the transistor 905 and a port Bias 907 for a current to bias the transistor 906. The LNA 900 also comprises an RF-input 911, an RF-input 912 and an RF-output 913.

In operation, the power supply 902 is connected to an operating voltage. According to the frequency band in use either one of the RF-inputs 911, 912 is activated by feeding a bias current to the corresponding port Bias 901, 907. In the case the LNA 900 is to handle the RF-signal in the first frequency band, the bias current is fed to the port Bias 901 to activate the transistor 905. At the same time the port Bias 907 is connected substantially to ground potential to deactivate the transistor 906. The RF-signal is input to the RF-input 911 and fed further to the transistor 905, which amplifies the RF-signal. The amplified RF-signal is then output through RF-output 913.

In a similar manner, in the case the LNA 900 is to handle the RF-signal in the second frequency band, the bias current is fed to the port Bias 907 to activate the transistor 906. At the same time the port Bias 901 is connected substantially to ground potential to deactivate the transistor 905. An RF-signal is input to the RF-input 912 and fed further to the transistor 906, which amplifies the RF-signal. The amplified RF-signal is then output through RF-output 913.

Figure 10:
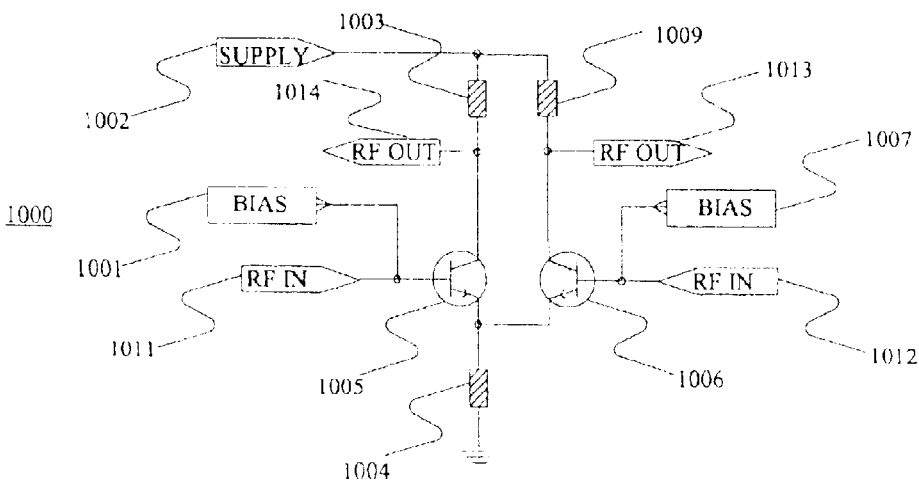
FIG. 10 shows an LNA according to a fifth embodiment of the present invention

An LNA 1000 according to a fifth embodiment of the present invention is shown in FIG. 10. The LNA 1000 comprises transistors 1005, 1006 sharing a degeneration impedance 1004. The transistor 1005 further has a load impedance 1003 and the transistor 1006 a load impedance 1009. The LNA 1000 is operated by a power supply 1002. Further the LNA 1000 comprises a port Bias 1001 for a current to bias the transistor 1005 and a port Bias 1007 for a current to bias the transistor 1006. The LNA also comprises an RF-input 1011, an RF-input 1012 and an RF-output 1013, 1014 for each of the transistors 1005, 1006.

In operation, the power supply 1002 is connected to an operating voltage. According to the frequency band in use either one of the RF-inputs 1011, 1012 is activated by feeding a bias current to the corresponding port Bias 1001, 1007. In the case the LNA 1000 is to handle the RF-signal in the first frequency band, the bias current is fed to the port Bias 1001 to activate the transistor 1005. At the same time the port Bias 1007 is connected substantially to ground potential to deactivate the transistor 1006. An RF-signal is input to the RF-input 1011 and fed further to the transistor 1005, which amplifies the RF-signal. The amplified RF-signal is then output through RF-output 1014.

In a similar manner, in the case in which the LNA 1000 is to handle the RF-signal in the second frequency band, the bias current is fed to the port Bias 1007 to activate the transistor 1006. At the same time the port Bias 1001 is connected substantially to ground potential to deactivate the transistor 1005. An RF-signal is input to the RF-input 1012 and fed further to the transistor 1006, which amplifies the RF-signal. The amplified RF-signal is then output through RF-output 1013.

A person skilled in the art understands that this embodiment necessitates some modifications to the receiver 400 described in FIG. 4 because of two outputs. This can be done, for example, by duplicating the chain after the LNA 1000 or by combining the signals later. The LNA 1000 can also be used in a case where the load impedances on different bands differ one from the other due to frequency dependency of the load. The person skilled in the art equally understands that although the transistors in the preceding embodiments have been described as Bipolar Junction Transistors (BJT), any other kind of amplifying elements, such as different kinds of Field Effect Transistors (FET) could be used.

Although FIGS. 5, 6, 7, 9 and 10 relate to embodiments in which two frequency bands are used, the number of different frequency bands is not limited by the present invention. The person skilled in the art understands that the receiver 400 can be modified to have an LNA which can handle an RF-signal in one of n frequency bands. Such a modified receiver 400 can also have several down conversions instead of just one implemented by the I-mixer 413 and the Q-mixer 423. A down conversion may also take place right after the LNA 405, after which the obtained intermediate frequency can be sampled and further processed in digital domain.

Figure 8:
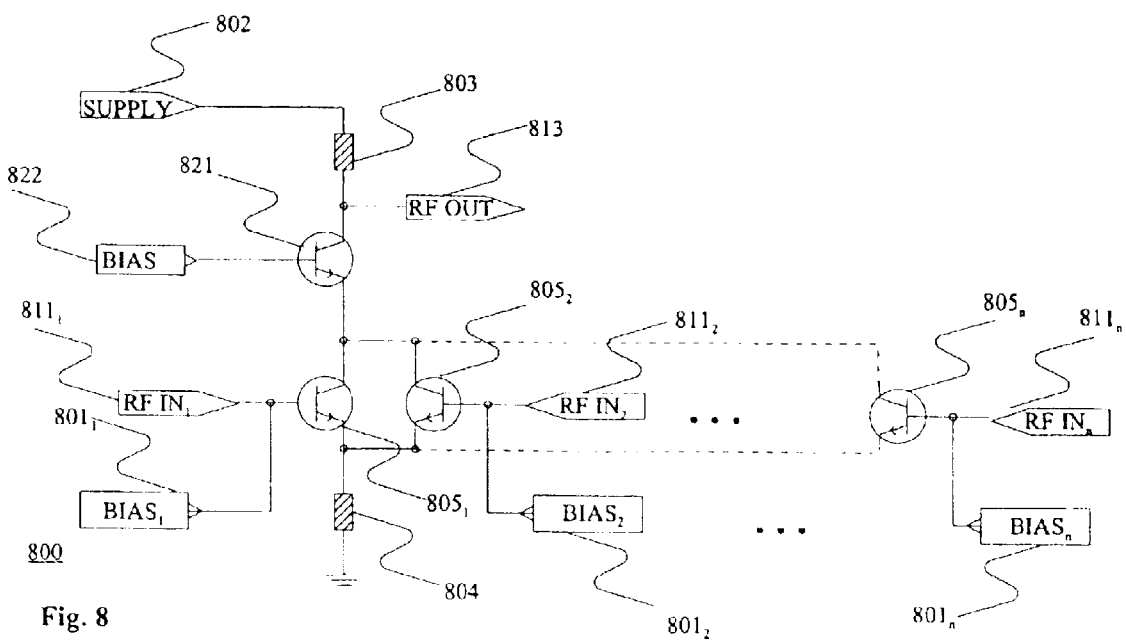
FIG. 8 shows the principle of an LNA according to the present invention with more than two different frequency bands.

FIG. 8 shows an LNA 800 according to a sixth embodiment of the invention. The LNA 800 is used in the case where n frequency bands are used. In order to deal with this, an LNA 800 with n inputs is used. The LNA 800 comprises n amplifying transistors $805_1$ to $805_n$, sharing a common degeneration impedance 804 and a common load impedance 803 through a cascade transistor 821. The cascade transistor 821 can also be referred to as cascade stage. Each one of the transistors $805_1$ to $805_n$ has a connection to a corresponding RF-input $811_1$ to $811_n$ and a corresponding port Bias $801_1$ to $801_n$.

In operation the power supply 802 is connected to an operating voltage. According to the frequency band in use one of the RF-inputs $811_1$ to $811_n$ is activated by feeding a bias current to the corresponding port Bias $801_x$, wherein x is the number of the frequency band in use. In the case in which the LNA 800 is to handle the RF-signal in the first frequency band, the bias current is fed to the port Bias $801_1$ to activate the transistor $805_1$. At the same time all the other ports Bias $801_2$ to $801_n$ are connected substantially to ground potential to deactivate them. The RF-signal is input to the RF-input $811_1$ and fed further to the transistor $805_1$, which amplifies the RF-signal. The amplified RF-signal is then output through RF-output 813.

In a similar manner, in the case the LNA 800 is to handle the RF-signal in one of the other frequency bands, the bias current is fed to the port Bias $801_x$ to activate the transistor $805_x$, wherein x is the number of the frequency band in use. At the same time the ports Bias $801_1$ to $801_{x-1}$ and $801_{x+1}$ to $801_n$ are connected substantially to ground potential to deactivate the transistors $805_1$ to $805_{x-1}$ and $805_{x+1}$ to $805_n$. The RF-signal is input to the RF-input $811_x$ and fed further to the transistor $805_x$, which amplifies the RF-signal. The amplified RF-signal is then output through RF-output 813.

A person skilled in the art clearly understands that the LNA with n inputs according to the present invention is not restricted to a single ended implementation. Such an LNA can equally be applied to the differential implementation of the LNA 700.

Figure 1:
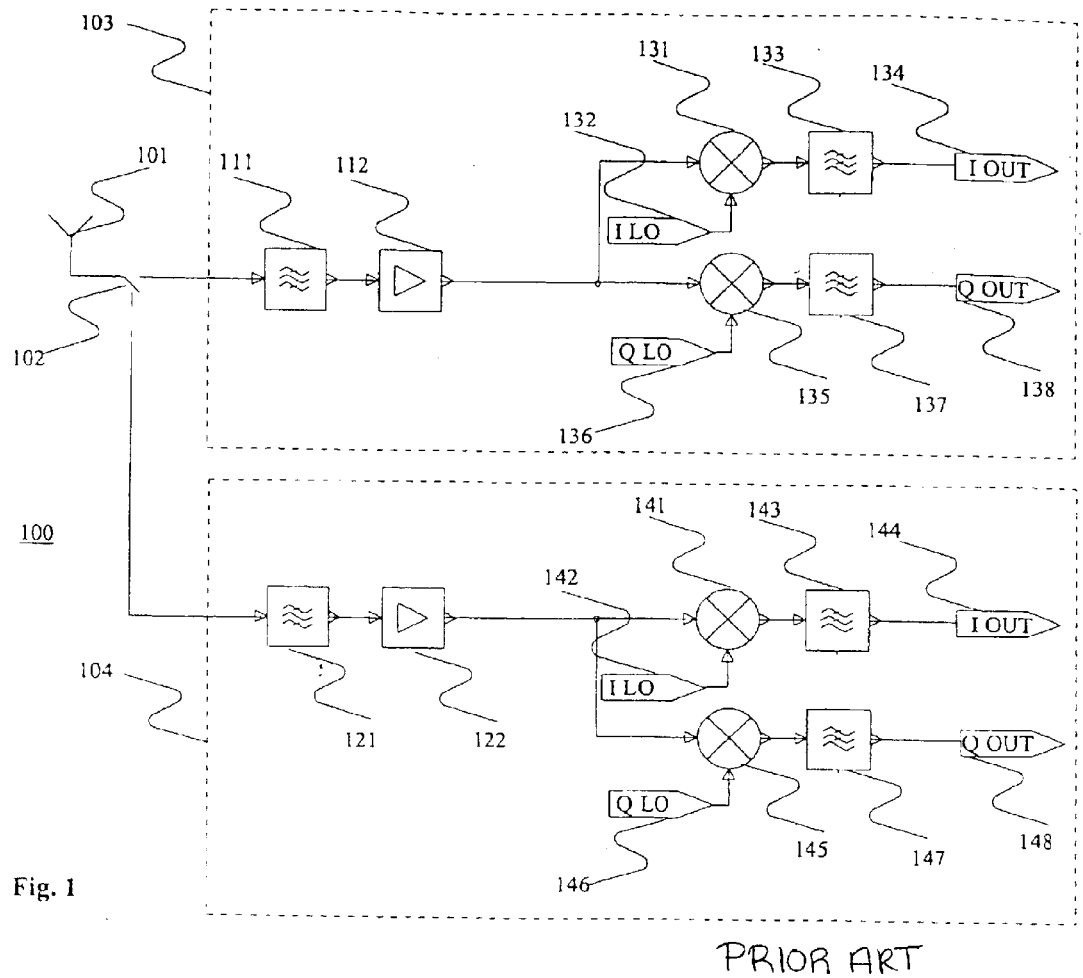
FIG. 1 shows a dual band receiver known in the prior art.
Figure 2:
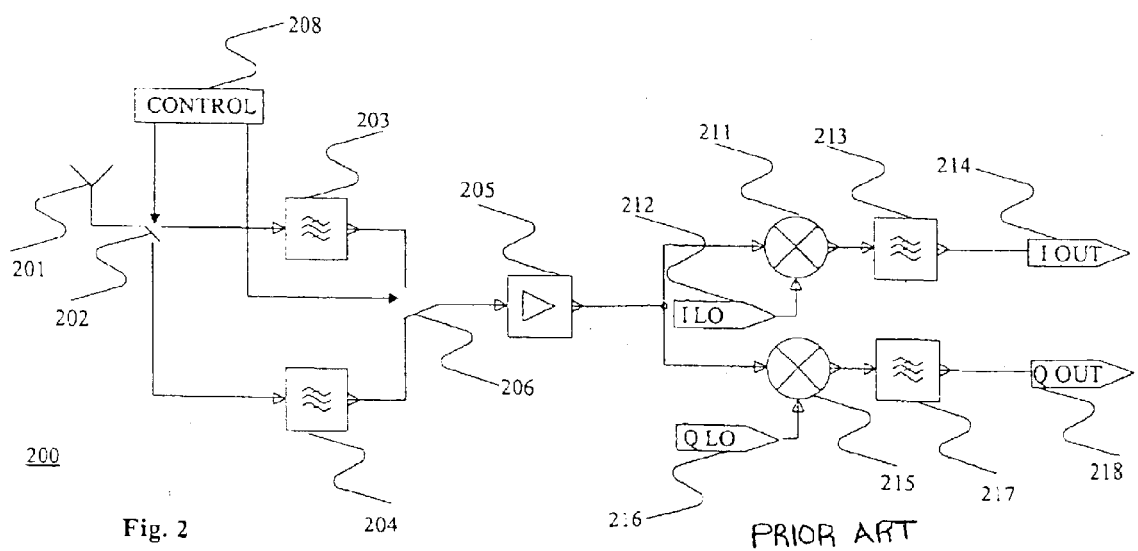
FIG. 2 shows an alternative dual band receiver known in the prior art.
Figure 3:
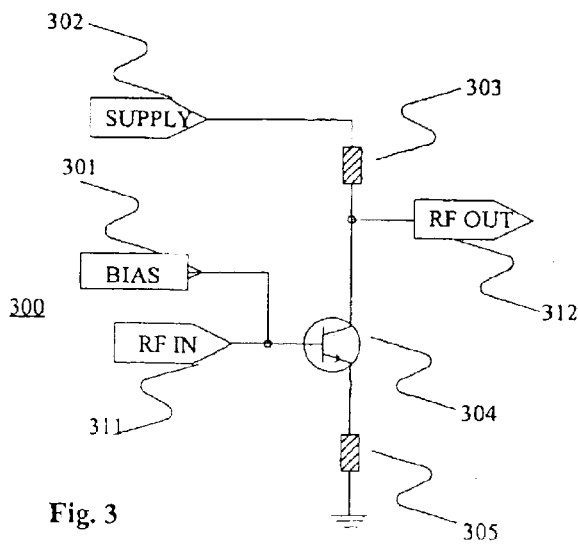
FIG. 3 shows a simplified circuit diagram for a low noise amplifier known in the prior art for multi-band receivers.
Figure 11:
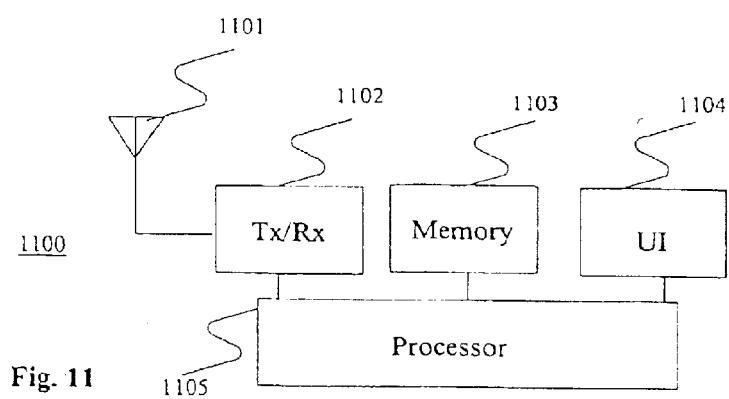
FIG. 11 shows a block diagram of a mobile station incorporating an LNA according to the present invention.

FIG. 11 shows a simplified block diagram of a mobile station 1100 according to the present invention. The mobile station 1100 comprises an antenna 1101, a transceiver 1102, a memory 1103, a user interface 1104 and a processor 1105. The transceiver 1102 comprises a receiver (not shown) and a transmitter (not shown). The receiver is implemented according to the present invention, as described with reference to FIG. 4. The functions of the micro controller 406 are preferably incorporated within the processor 1105. The processor 1105 also controls all the other parts of the mobile station 1100. The memory 1103 stores a running programme for the processor 1105 and all the necessary parameters and variables needed. The user interface 1104 is used as a man-machine interface to provide interaction between the mobile station 1100 and a user of the mobile station 1100.

The person skilled in the art clearly understands that the mobile station 1100 also comprises further components, such as a subscriber identification module (SIM) and/or a modem. These are not shown in order to simplify the figure.

Although described in the context of presently preferred embodiments, it should be noted that a number of modifications to these teachings may occur to the person skilled in the art. It will thus be understood by the persons skilled in the art that even though the invention has been shown and described with respect to preferred embodiments thereof, several changes may be made therein without departing from the scope and the spirit of the invention. These changes and modifications, which are clear to those skilled in the art, are intended to be included within the scope of the present invention as defined by the enclosed claims.

What is claimed is:

1. A low noise amplifier for amplifying signals in a plurality of frequency bands, the low noise amplifier comprising a plurality of amplifying elements, each one of the plurality of amplifying elements being connected to a load impedance and to a degeneration impedance and being configured to amplify signals in only one frequency band of the plurality of frequency bands, wherein the plurality of amplifying elements are connected in parallel and at least two of the plurality of amplifying elements are both connected to at least one of a common load impedance and a common degeneration impedance.

2. A low noise amplifier according to claim 1, wherein at least two of the plurality of amplifying elements are both connected to the same load impedance and to the same degeneration impedance.

3. A low noise amplifier according to claim 1, wherein at least two of the plurality of amplifying elements are both connected to the same load impedance and at least a first one of the plurality of amplifying elements is connected to a first degeneration impedance and at least a second one of the plurality of amplifying elements is connected to a second degeneration impedance, the first degeneration impedance and the second degeneration impedance not being the same.

4. A low noise amplifier according to claim 1, wherein at least two of the plurality of amplifying elements are both connected to the same degeneration impedance and at least a first one of the plurality of amplifying elements is connected to a first load impedance and at least a second one of the plurality of amplifying elements is connected to a second load impedance, the first load impedance and the second load impedance not being the same.

5. A low noise amplifier according to claim 1, wherein a switching signal switches the plurality of amplifying elements so that at least one of the plurality of amplifying elements is activated and the rest of the plurality of amplifying elements are deactivated.

6. A low noise amplifier according to claim 5, wherein one of the plurality of amplifying elements to be activated is activated by feeding a bias to a bias port of the one of the plurality of amplifying elements to be activated and the rest of the amplifying elements are deactivated by grounding bias ports of rest of the amplifying elements.

7. A low noise amplifier according to claim 1, wherein the load impedance comprises a component selected from a group consisting of an inductor, a capacitor and a resistor.

8. A low noise amplifier according to claim 1, wherein the degeneration impedance comprises a component selected from a group consisting of an inductor, a capacitor and a resistor.

9. A low noise amplifier according to claim 1, wherein the low noise amplifier comprises a cascade stage connected between the load impedance and at least one of the plurality of amplifying elements.

10. A low noise amplifier according to claim 1, wherein each of the amplifying elements comprises a transistor in single ended configuration.

11. A low noise amplifier according to claim 1, wherein each of the amplifying elements comprises a pair of transistors in differential configuration.

12. A low noise amplifier according to claim 1, wherein each of the amplifying elements comprise a Bipolar Junction Transistor.

13. A low noise amplifier according to claim 1, wherein each of the amplifying elements comprises a Field Effect Transistor.

14. A radio receiver comprising a low noise amplifier for amplifying signals in a plurality of frequency bands, the low noise amplifier comprising a plurality of amplifying elements, each one of the plurality of amplifying elements being connected to a load impedance and to a degeneration impedance and being configured to amplify signals in only one frequency band of the plurality of frequency bands, wherein the plurality of amplifying elements are connected in parallel and at least two of the plurality of amplifying elements are both connected to at least one of a common load impedance and a common degeneration impedance.

15. A radio receiver according to claim 14, wherein at least two of the plurality of amplifying elements are both connected to the same load impedance and to the same degeneration impedance.

16. A radio receiver according to claim 14, wherein at least two of the plurality of amplifying elements are both connected to the same load impedance and at least a first one of the plurality of amplifying elements is connected to a first degeneration impedance and at least a second one of the plurality of amplifying elements is connected to a second degeneration impedance, the first degeneration impedance and the second degeneration impedance not being the same.

17. A radio receiver according to claim 14, wherein at least two of the plurality of amplifying elements are both connected to the same degeneration impedance and at least a first one of the plurality of amplifying elements is connected to a first load impedance and at least a second one of the plurality of the amplifying elements is connected to a second load impedance, the first load impedance and the second load impedance not being the same.

18. A radio receiver according to claim 14, wherein a switching signal switches the plurality of amplifying elements so that at least one of the plurality of amplifying elements is activated and the rest of the plurality of amplifying elements are deactivated.

19. A radio receiver according to claim 18, wherein one of the plurality of amplifying elements to be activated is activated by feeding a bias to a bias port of the one of the plurality of amplifying elements to be activated and the rest of the amplifying elements are deactivated by grounding bias ports of the amplifying elements to be deactivated.

20. A radio receiver according to claim 14, wherein the load impedance comprises a component selected from a group consisting of an inductor, a capacitor and a resistor.

21. A radio receiver according to claim 14, wherein the degeneration impedance comprises a component selected from a group consisting of an inductor, a capacitor and a resistor.

22. A radio receiver according to claim 14, wherein the low noise amplifier comprises a cascade stage connected between the load impedance and the plurality of amplifying elements.

23. A radio receiver according to claim 14, wherein each of the amplifying elements comprises a transistor in single ended configuration.

24. A radio receiver according to claim 14, wherein each of the amplifying elements comprises a pair of transistors in differential configuration.

25. A radio receiver according to claim 14, wherein the amplifying element comprises a Bipolar Junction Transistor.

26. A radio receiver according to claim 14, wherein the amplifying element comprises a Field Effect Transistor.

27. A mobile station capable of communicating in a plurality of frequency bands and comprising a receiver for amplifying signals in a plurality of frequency bands, the receiver comprising a plurality of amplifying elements, each one of the plurality of amplifying elements being connected to a load impedance and to a degeneration impedance and being configured to amplify signals in only one of the plurality of frequency bands, wherein the plurality of amplifying transistors are connected in parallel and at least two of the plurality of amplifying transistors are both connected to at least one of a common load impedance and a common degeneration impedance.

28. A mobile station according to claim 27, wherein at least two of the plurality of amplifying elements are both connected to the same load impedance and to the same degeneration impedance.

29. A mobile station according to claim 27, wherein at least two of the plurality of amplifying elements are both connected to the same load impedance and at least a first one of the plurality of amplifying elements is connected to a first degeneration impedance and at least a second one of the plurality of amplifying elements is connected to a second degeneration impedance, the first degeneration impedance and the second degeneration impedance not being the same.

30. A mobile station according to claim 27, wherein at least two of the plurality of amplifying elements are both connected to the same degeneration impedance and at least a first one of the plurality of amplifying elements is connected to a first load impedance and at least a second one of the plurality of amplifying elements is connected to a second load impedance, the first load impedance and the second load impedance not being the same.

31. A mobile station according to claim 27, wherein a switching signal switches the plurality of amplifying elements so that at least one of the plurality of amplifying elements is activated and the rest of the plurality of amplifying elements are deactivated.

32. A mobile station according to claim 27, wherein one of the plurality of amplifying elements to be activated is activated by feeding a bias to a bias port of the one of the plurality of amplifying elements to be activated and the rest of the amplifying elements are deactivated by grounding the bias ports of the amplifying elements to be deactivated.

33. A mobile station according to claim 27, wherein the frequency bands comprise a frequency band defined to be used by a cellular telephony system selected from a group consisting of GSM 800, GSM 900, GSM 1800, GSM 1900, TDMA, UMTS.

* * * * *